(12) United States Patent
Song et al.

(10) Patent No.: US 8,102,479 B2
(45) Date of Patent: Jan. 24, 2012

(54) THIN FILM TRANSISTOR DISPLAY PANEL AND METHOD OF MANUFACTURING THE SAME

(75) Inventors: Jun-Ho Song, Seongnam-si (KR); Woong-Kwon Kim, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 277 days.

(21) Appl. No.: 12/504,012

(22) Filed: Jul. 16, 2009

(65) Prior Publication Data

US 2010/0038644 A1   Feb. 18, 2010

(30) Foreign Application Priority Data

Aug. 14, 2008   (KR) .................. 10-2008-0080044

(51) Int. Cl.
*G02F 1/136* (2006.01)
(52) U.S. Cl. .................. 349/43; 349/139; 349/141
(58) Field of Classification Search .............. 349/43
See application file for complete search history.

(56) References Cited

U.S. PATENT DOCUMENTS

| 7,005,332 B2 | 2/2006 | Wu et al. |
| 7,012,665 B2* | 3/2006 | Asai et al. .................. 349/141 |
| 2007/0121047 A1* | 5/2007 | Chung et al. .................. 349/141 |

FOREIGN PATENT DOCUMENTS

| KR | 1020040004055 A | 1/2004 |
| KR | 1020050077793 A | 8/2005 |

* cited by examiner

*Primary Examiner* — Richard Kim
(74) *Attorney, Agent, or Firm* — Cantor Colburn LLP

(57) ABSTRACT

A thin film transistor display panel includes an insulating substrate, gate lines and data lines disposed intersecting each other on the insulating substrate so as to be electrically insulated from each other, common lines provided on the insulating substrate in parallel to the gate lines, a gate insulating film disposed on the gate lines and the common lines, contact holes disposed passing through the gate insulating film disposed on the common lines, a plurality of common electrodes electrically connected to the common lines through the contact holes and arranged in parallel to each other, and a plurality of pixel electrodes arranged in parallel to the common electrodes. The thickness of the common electrode and the pixel electrode is smaller than that of the data line.

18 Claims, 14 Drawing Sheets

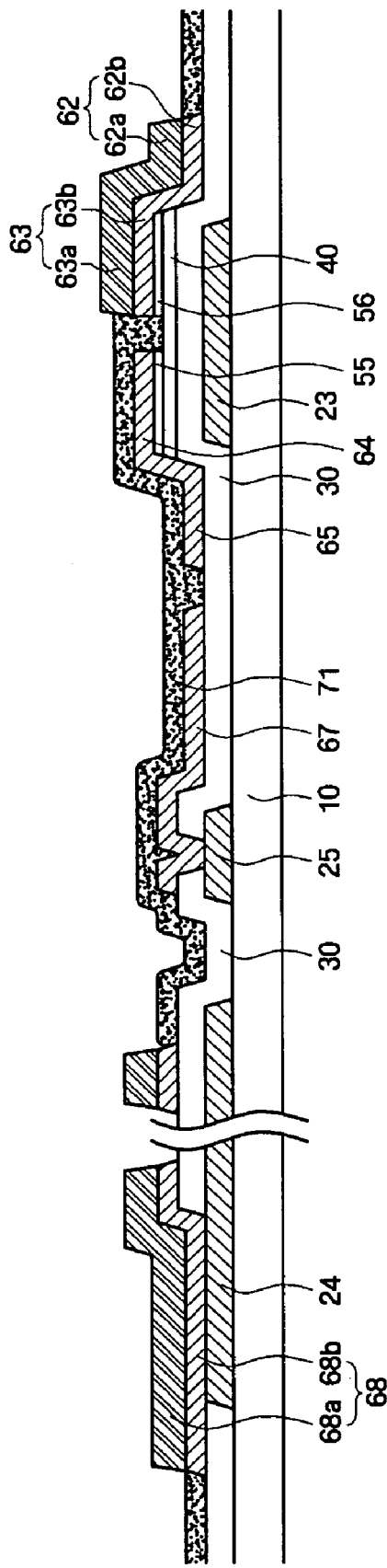

FIG. 3A
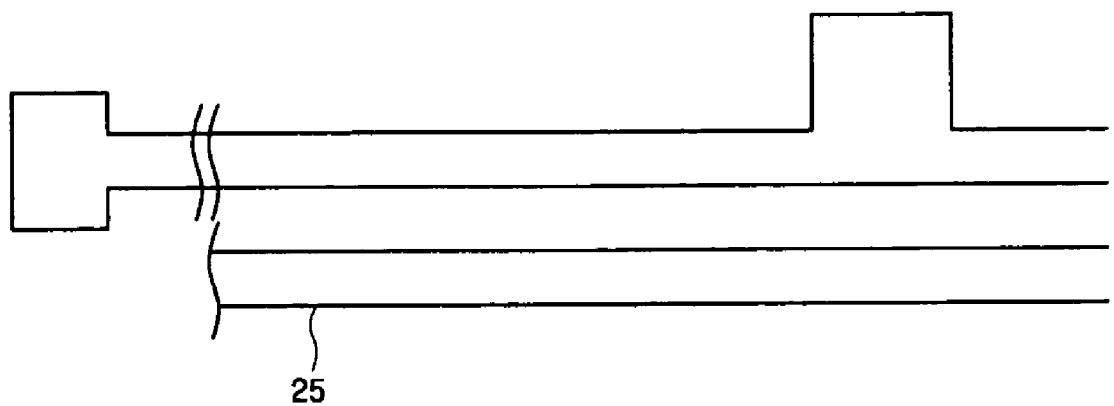
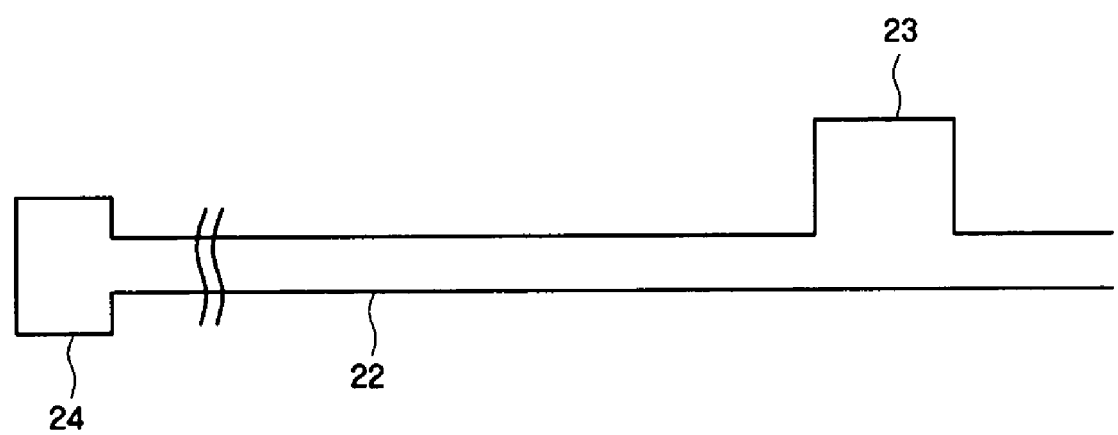

FIG. 3B
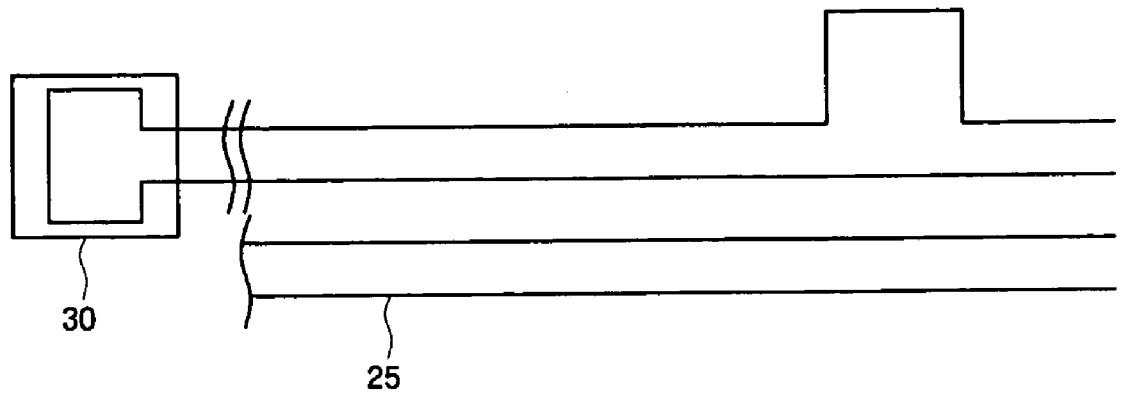
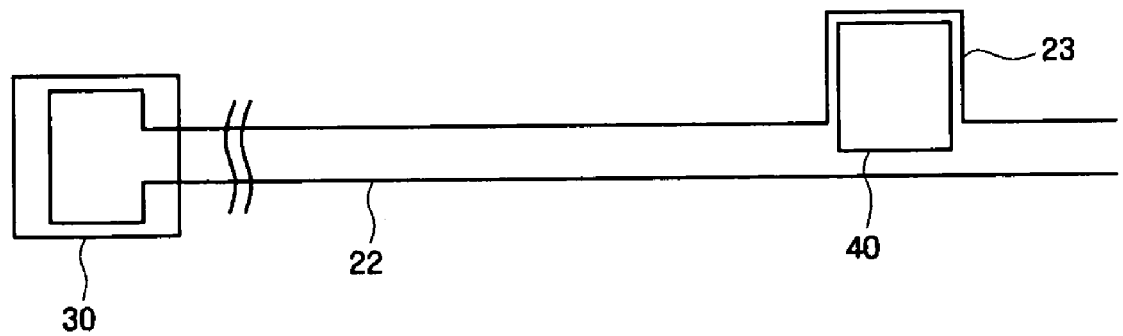

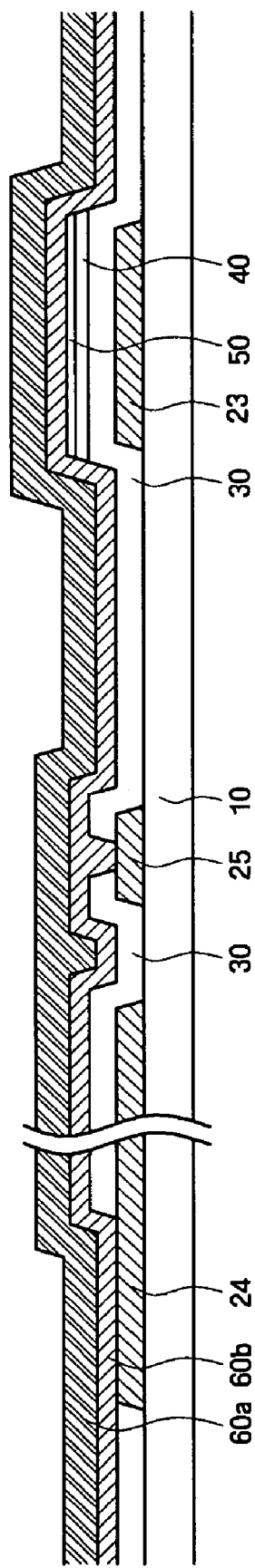
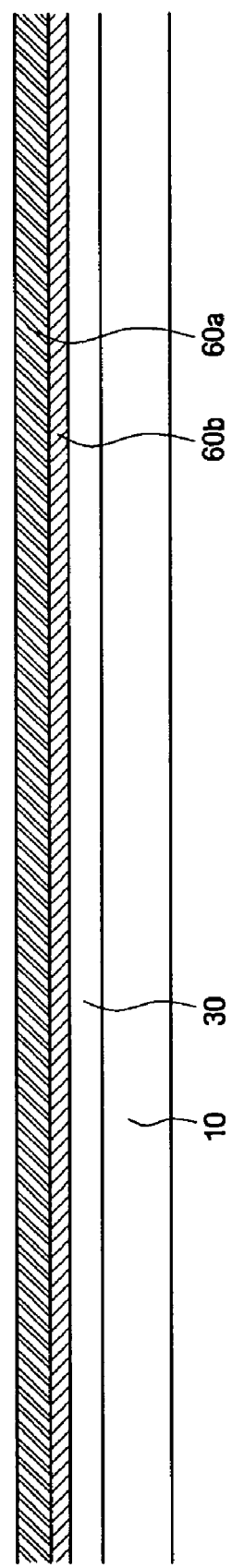

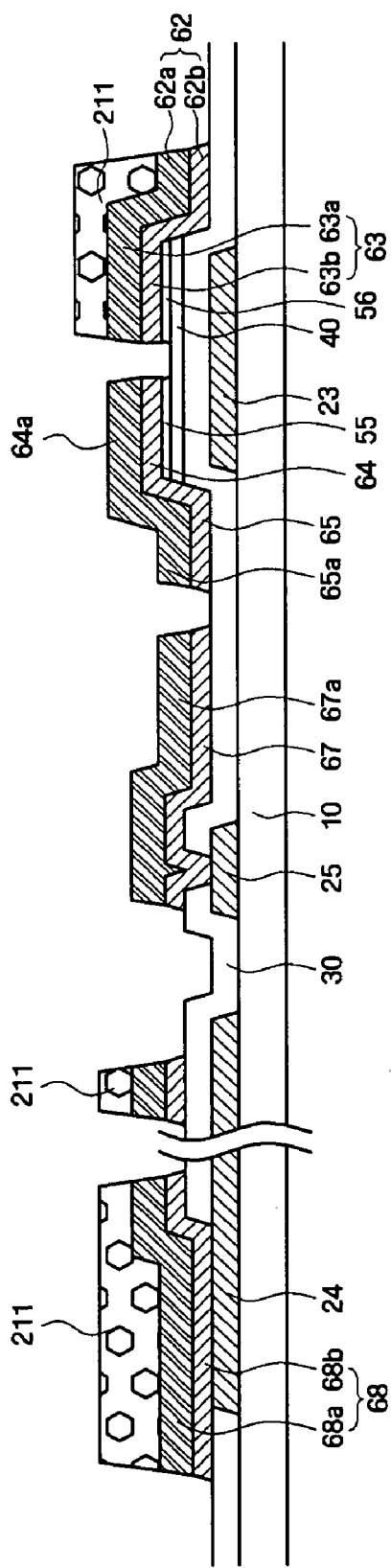
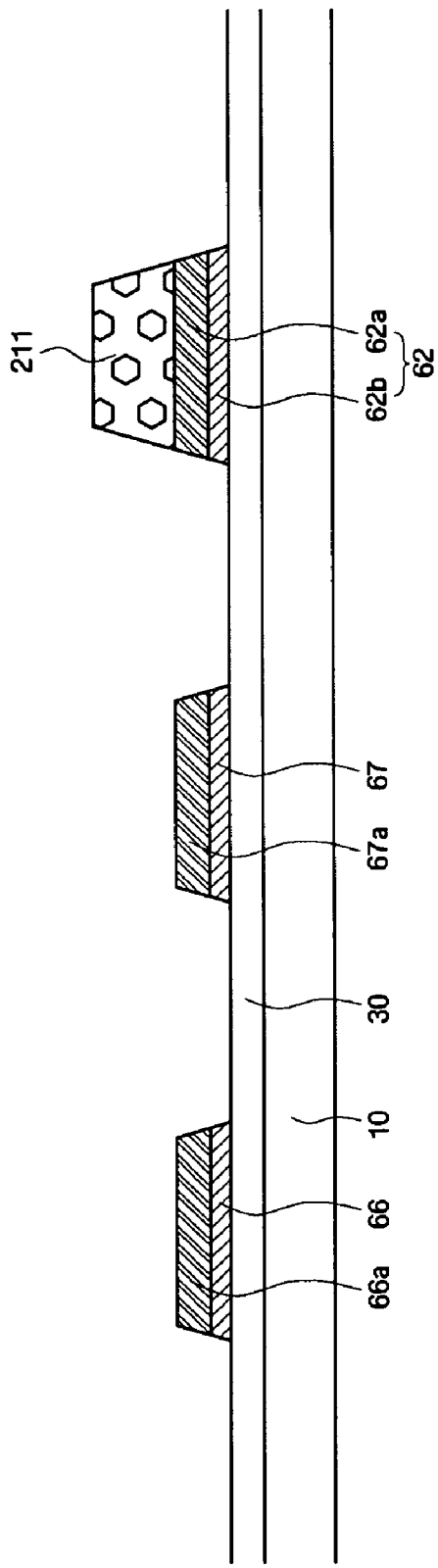
FIG. 9A
FIG. 9B

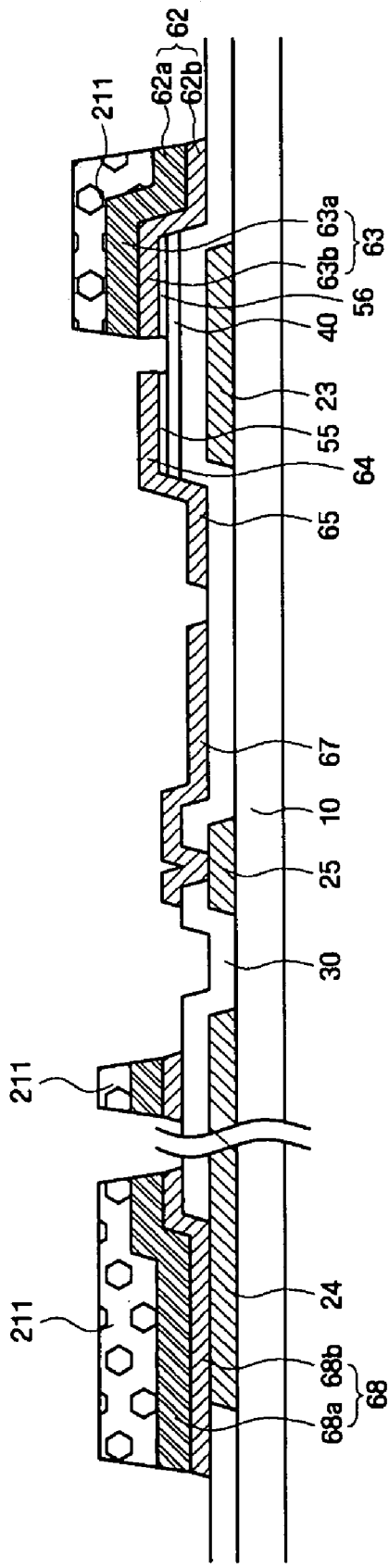

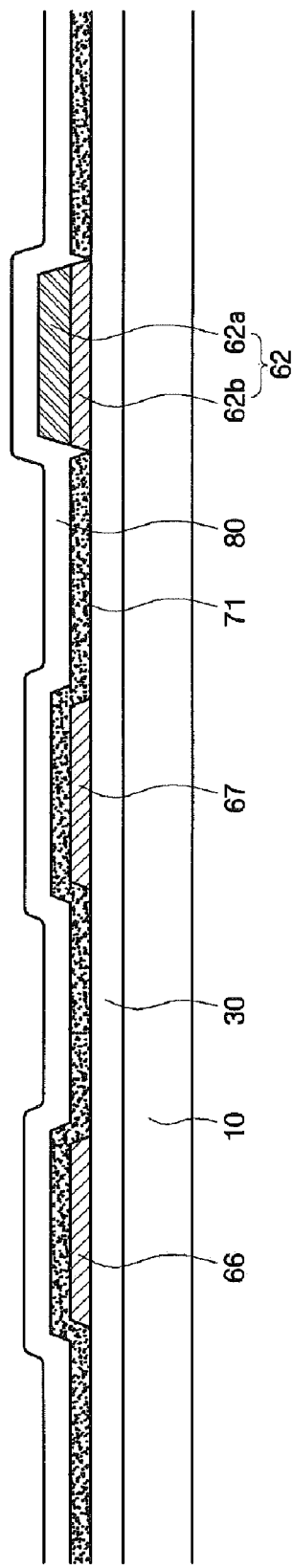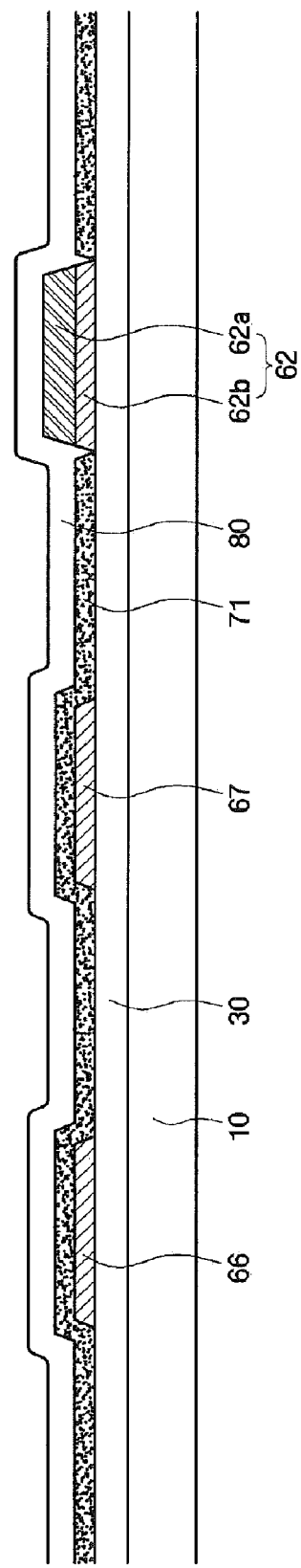

THIN FILM TRANSISTOR DISPLAY PANEL AND METHOD OF MANUFACTURING THE SAME

This application claims priority to Korean Patent Application No. 10-2008-0080044 filed on Aug. 14, 2008 and all the benefits accruing therefrom under 35 U.S.C. §119, the contents of which is incorporated herein by reference in its entirety.

BACKGROUND OF THE INVENTION

1. Field of the Invention

The present invention relates to a thin film transistor display panel and a method of manufacturing the same, and more particularly, to a thin film transistor display panel capable of reducing or effectively preventing deterioration of image quality caused by a difference in thickness between wiring lines, to improve display quality and a method of manufacturing the same.

2. Description of the Related Art

With improvements made in information technology, there is an increasing demand for larger and thinner display devices. However, conventional cathode ray tube ("CRT") displays are insufficient to meet the demand. Therefore, flat display devices, such as a PDP (plasma display panel), a PALC (plasma-addressed liquid crystal display panel), an LCD (liquid crystal display), and an OLED (organic light-emitting diode) device, are in greater demand. In particular, lighter and thinner display devices which can display high-resolution images in various electronic apparatuses have come into widespread use.

LCD is an exemplary of one of the flat panel displays ("FPDs"), and may include two display panels having electrodes formed thereon and a liquid crystal layer interposed between the two display panels. In the LCD, a voltage is applied to the electrodes to rearrange liquid crystal molecules in the liquid crystal layer, thereby adjusting the amount of light passing through the liquid crystal layer. In this way, the LCD displays images.

Each of the display panels may be formed by forming a plurality of thin film patterns on an insulating substrate.

BRIEF SUMMARY OF THE INVENTION

Since display panels may be manufactured by forming a plurality of thin film patterns on an insulating substrate, there may be disadvantages in the manufacturing process. For example, the thin film patterns may be formed by a photolithography process, which includes a photoresist coating process, a mask arranging process, an exposure process, a baking process, a development process, and/or a cleaning process. The overall manufacturing time and cost are affected by each process. Therefore, when the number of processes is relatively large, manufacturing time and costs increase, while when the number of processes is decreased, the manufacturing cost can be advantageously reduced.

However, while techniques for reducing the number of mask processes has been developed in order to reduce the manufacturing cost, there may be technical challenges in manufacturing the display panels. For example, it is necessary to form each component into an optimal shape, while reducing the number of mask processes.

An exemplary embodiment of the present invention provides a thin film transistor display panel capable of reducing or effectively preventing deterioration of image quality caused by a difference in thickness between wiring lines, to improve display quality.

An exemplary embodiment of the present invention provides a method of manufacturing a thin film transistor display panel capable of reducing or effectively preventing deterioration of image quality caused by a difference in thickness between wiring lines, to improve display quality.

An exemplary embodiment provides a thin film transistor display panel including an insulating substrate, gate lines and data lines provided in a lattice shape on the insulating substrate so as to be electrically insulated from each other, common lines provided on the insulating substrate in parallel to the gate lines, a gate insulating film disposed on the gate lines and the common lines, contact holes passing through the gate insulating film disposed corresponding to the common lines, a plurality of common electrodes electrically connected to the common lines through the contact holes and arranged in parallel to each other, and a plurality of pixel electrodes arranged in parallel to the common electrodes. The thickness of the common electrodes and the pixel electrodes is smaller than that of the data lines.

Each of the common electrode and the pixel electrode may be formed in a single layer structure, and the data line may be formed in a multi-layer structure.

The common electrodes and the pixel electrodes may include copper, and the data lines may include an upper layer including at least one of copper (Cu) and molybdenum (Mo) and a lower layer including at least one of molybdenum (Mo), titanium (Ti), chrome (Cr), tungsten (W), and aluminum (Al).

The common electrodes, the pixel electrodes, and the lower layer of the data lines each may have a thickness of less than about 50 nanometers (nm), and the upper layer of the data lines may have a thickness of more than about 1500 Å.

The thin film transistor display panel may further include thin film transistors each including a gate electrode connected to the gate lines, a source electrode connected to the data lines, and a drain electrode connected to the pixel electrodes, and the thickness of the drain electrode may be smaller than that of the source electrode.

The drain electrode may be formed in a single layer structure, and the source electrode may be formed in a multi-layer structure.

The thickness of the drain electrode and the connecting electrode, may be smaller than that of the source electrode.

The common electrodes and the pixel electrodes may be alternately arranged.

The thin film transistor display panel may further include a first protective film disposed on the pixel electrodes and the common electrodes.

The thin film transistor display panel may further include a second protective film disposed on the data lines and the first protective film.

An exemplary embodiment provides a method of manufacturing a thin film transistor display panel, the method including forming on an insulating substrate gate lines and common lines arranged in parallel to the gate line, forming a gate insulating film on the gate lines and the common lines, forming contact holes in the gate insulating film disposed on the common lines, and forming a plurality of common electrodes electrically connected to the common lines through the contact holes and are arranged in parallel to each other, a plurality of pixel electrodes arranged in parallel to the common electrodes, and data lines intersecting the gate lines. The thickness of the common electrode and the pixel electrode is smaller than that of the data line.

Each of the common electrode and the pixel electrode may be formed in a single layer structure, and the data line may be formed in a multi-layer structure.

The common electrodes and the pixel electrodes may include copper, and the data lines may include an upper layer including at least one of copper (Cu) and molybdenum (Mo) and a lower layer including at least one of molybdenum (Mo), titanium (Ti), chrome (Cr), tungsten (W), and aluminum (Al).

The method may further include forming thin film transistors each including a gate electrode connected to the gate lines, a source electrode connected to the data lines, and a drain electrode connected to the pixel electrodes, and the thickness of the drain electrode may be smaller than that of the source electrode.

The drain electrode may be formed in a single layer structure, and the source electrode may be formed in a multi-layer structure.

The common electrodes and the pixel electrodes may be alternately arranged.

The forming of the data lines, the common electrodes, and the pixel electrodes may include sequentially forming a first data conductive layer and a second data conductive layer on the insulating substrate, forming a photoresist pattern on the first and second data conductive layers using a slit mask or a halftone mask, and etching the first and second data conductive layers using the photoresist pattern as an etching mask.

The photoresist pattern may include a first region in which the data lines are formed and a second region in which the common electrodes and the pixel electrodes are formed, and the second region may be thinner than the first region.

The method may further include forming a first protective film on the pixel electrodes and the common electrodes.

The method may further include forming a second protective film on the data lines and the first protective film.

BRIEF DESCRIPTION OF THE DRAWINGS

The above and other aspects and features of the present invention will become more apparent by describing in detail exemplary embodiments thereof with reference to the attached drawings, in which:

FIG. 2A is a cross-sectional view illustrating the thin film transistor display panel taken along line IIa-IIa' of FIG. 1;

FIG. 2B is a cross-sectional view illustrating the thin film transistor display panel taken along line IIb-IIb' of FIG. 1;

FIGS. 3A and 3B are diagrams illustrating exemplary embodiments of processes of manufacturing the thin film transistor display panel shown in FIG. 1;

FIG. 4A to FIG. 11B are cross-sectional views illustrating manufacturing processes in an exemplary embodiment of a method of manufacturing a thin film transistor display panel according to the invention;

FIG. 13A is a cross-sectional view illustrating the thin film transistor display panel taken along line XIIIa-XIIIa' of FIG. 12; and FIG. 13B is a cross-sectional view illustrating the thin film transistor display panel taken along line XIIIb-XIIIb' of FIG. 12.

DETAILED DESCRIPTION OF THE INVENTION

Figure 1:
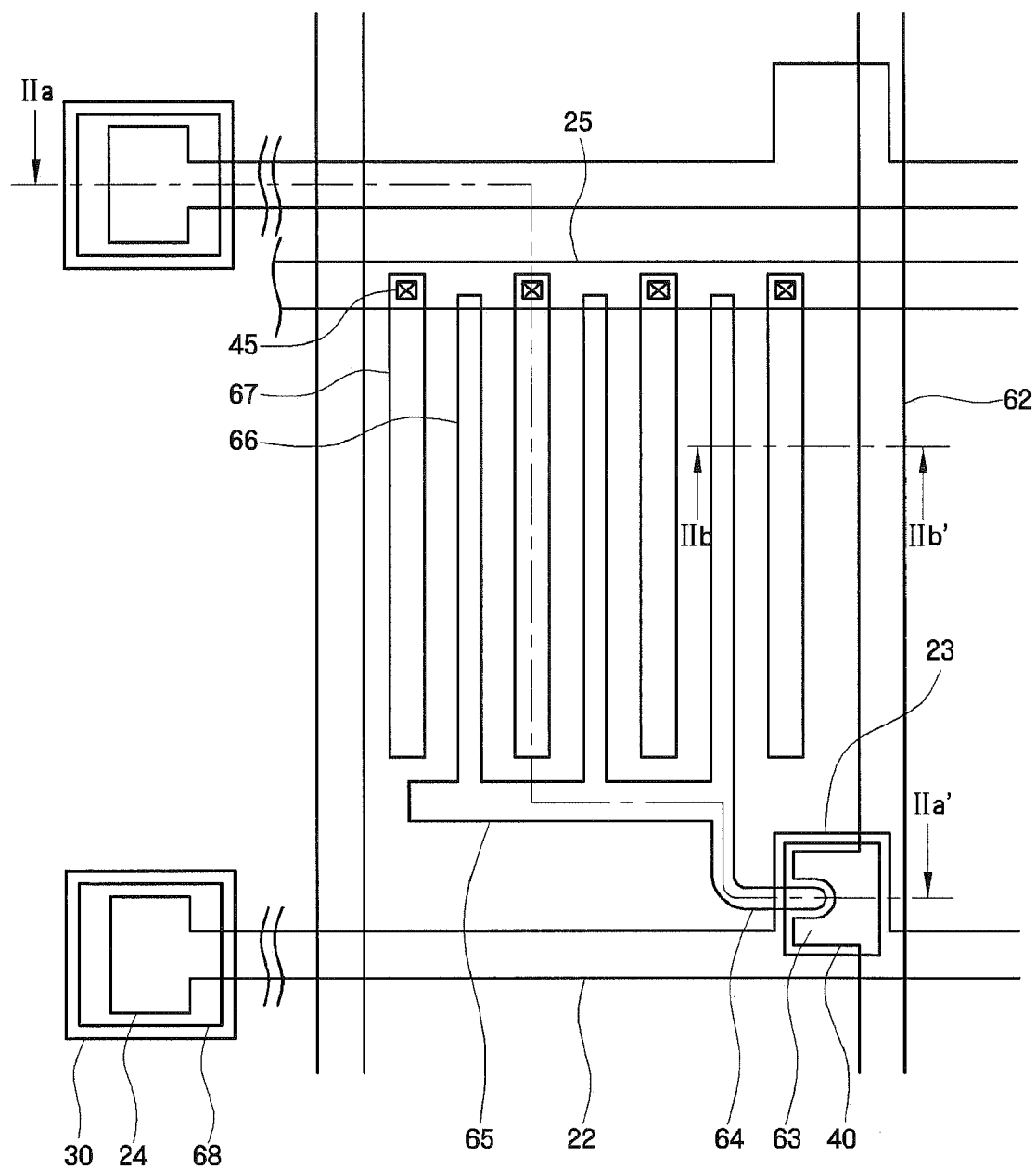
FIG. 1 is a layout view illustrating an exemplary embodiment of a thin film transistor display panel according to the invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below", "lower", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings. However, the aspects, features and advantages of the present invention are not restricted to the ones set forth herein. The above and other aspects, features and advantages of the present invention will become more apparent to one of ordinary skill in the art to which the present invention pertains by referencing a detailed description of the present invention given below.

Hereinafter, an exemplary embodiment of a thin film transistor display panel according to the invention will be described in detail with reference to FIGS. 1 to 2B. FIG. 1 is a layout view illustrating an exemplary embodiment of the thin film transistor display panel according to the invention. FIG. 2A is a cross-sectional view illustrating the thin film transistor display panel taken along line IIa-IIa' of FIG. 1. FIG. 2B is a cross-sectional view illustrating the thin film transistor display panel taken along line IIb-IIb' of FIG. 1.

A plurality of gate lines 22, gate pads 24, and gate electrodes 23 are disposed on an insulating substrate 10. In an exemplary embodiment, the insulating substrate may include, but is not limited to, transparent glass.

The gate lines 22 extend in a first direction, such as the horizontal direction of FIG. 1, and are configured to transmit gate signals. A plurality of gate lines 22 are disposed on the insulating substrate 10 so as to be arranged substantially in parallel to each other, and in a same direction. The gate pad 24 is disposed at an end of each of the plurality of gate lines 22. The gate pad 24 has a width, taken in a second (e.g., vertical) direction substantially perpendicular to the first (horizontal) direction, larger than a width taken in the second direction of the gate line 22.

The gate electrode 23 may protrude from the gate line 22 in the second direction. A plurality of the gate electrode 23 may be electrically and physically connected to the gate line 22. The gate line 22, the gate electrode 23 and the gate pad 24 are a single, continuous and indivisible member. The gate line 22, the gate pad 24, and the gate electrode 23 are hereinafter referred to collectively as a gate wiring line.

A plurality of a common line 25 is disposed on the insulating substrate 10. The plurality of common lines 25 extend in the first direction, substantially in parallel to each other, and substantially parallel to the gate lines 22. The common lines 25 may be disposed in a same layer as the gate wiring line, or at a same distance from the insulating substrate 10 as the gate wiring line. Each of the common lines 25 may be electrically and physically connected to each of a plurality of a common electrode 67, and supplies a common voltage to the common electrodes 67. A single common line 25 may be connected to an end of each of the plurality of the common electrodes 67, as illustrated in FIG. 1. The common line 25 may be connected to each of the common electrodes 67 through a contact hole 45 display at each of the ends of the common electrodes 67. Each of first ends of the plurality of common electrodes 67, and each of distal first ends of the pixel electrodes 66 may overlap with a portion of a width of the common line 25.

A portion of a plurality of a pixel electrode 66 and an entire of the plurality of common electrodes 67 may be alternately arranged with each other, and disposed between each of a pair of adjacent gate lines 22. The portions of the pixel electrodes 66 and the entire of the plurality of common electrodes 67 may be extended in the second direction, so as to be substantially parallel to data line 62 extending in the second direction. In an exemplary embodiment, the pixel electrodes 66 and the common electrodes 67 disposed between adjacent gate lines 22 and adjacent data lines 62 may be considered as defining a pixel region. The portions of the pixel electrodes 66 and the entire of the plurality of common electrodes 67 may be may be disposed separated from each other, and separated from the adjacent data lines 62, in the first (horizontal) direction.

In an exemplary embodiment, the gate wiring line including the gate lines 22, the gate electrodes 23, and the gate pads 24, and the common line 25 may be similarly formed of an aluminum-based metallic material, such as aluminum (Al) or an aluminum alloy, a silver-based metallic material, such as silver (Ag) or an Ag alloy, a copper-based metallic material, such as copper (Cu) or a Cu alloy, a molybdenum-based metallic material, such as molybdenum (Mo) or a Mo alloy, chrome (Cr), titanium (Ti), or tantalum (Ta).

In addition, an exemplary embodiment of the gate wiring line (22, 23, and 24) and the common line 25 may have a multi-layer structure including two conductive films (not shown) having different physical properties. One of the two conductive films may be formed of a relatively low-resistivity metal, such as aluminum-based metal, silver-based metal, or copper-based metal, in order to reduce a signal delay or a voltage drop in the gate wiring line (22, 23, and 24) and the common line 25. The other of the two conductive films may be formed of a material different from the above, particularly, a material having relatively good contact characteristics with other materials, such as molybdenum-based metal, chrome, titanium, or tantalum. In one exemplary embodiment, a combination of the conductive films may include a laminated structure of a lower chrome film and an upper copper (Cu) film, and a laminated structure of a lower titanium film and an upper molybdenum film. However, the present invention is not limited thereto, but the gate wiring line (22, 23, and 24) and the common line 25 may be formed of various metallic materials and conductors.

Referring to FIGS. 2A and 2B, a gate insulating film 30 may be disposed overlapping the gate wiring line (22, 23, and 24) and the common line 25, except for the gate pad 24 and the contact hole 45. In an exemplary embodiment, the gate insulating film 30 may include silicon nitride (SiNx). The gate insulating film 30 insulates the gate wiring line (22, 23, and 24) and the common line 25, from a data wiring line (62, 63, and 64), which will be described below. The gate insulating film 30 is interposed between the data wiring line (62, 63, and 64), and the gate wiring line (22, 23, and 24) and the common line 25, in an overlap region where the data wiring line (62, 63, and 64) overlaps the gate wiring line (22, 23, and 24) and the common line 25, respectively.

The gate insulating film 30 is disposed on substantially an entire upper surface of the insulating substrate 10, except for a portion of the thin film transistor display panel which is electrically connected to the gate wiring line (22, 23, and 24) or the common line 25, such as the gate pad 24 and/or the contact hole 45.

Referring again to FIGS. 2A and 2B, a semiconductor layer 40 is disposed on the gate insulating film 30, and may include hydrogenated amorphous silicon. Resistive contact layers 55 and 56 are disposed on the gate insulating film 30 and the semiconductor layer 40, and may include silicide or n+ hydrogenated amorphous silicon heavily doped with n-type impurities. The semiconductor layer 40 defines a channel region of a thin film transistor. The channel region includes the semiconductor layer 40 overlapping the gate electrode 23. The resistive contact layers 55 and 56 have substantially a same pattern as the semiconductor layer 40, except for the channel region on an overlap region with the gate electrode 23. Inner boundaries of the resistive contact layers 55 and 56, and the semiconductor layer 40 at the channel region, and outer boundaries of the resistive contact layers 55 and 56, and the semiconductor layer 40 may substantially coincide with each other. The resistive contact layers 55 and 56 are separated from each other with the channel region interposed therebetween.

In a layout view or a plan view, the semiconductor layer 40 may have various shapes, such as an island shape and a linear shape. In the illustrated embodiment, the semiconductor layer 40 may have an island shape.

A source electrode 63 and a drain electrode 64 are disposed on the semiconductor layer 40 and the resistive contact layers 55 and 56. The source electrode 63 and the drain electrode 64 are separated from each other by a distance corresponding to the channel region, and the gate electrode 23 is arranged below the semiconductor layer 40. The source electrode 63, the drain electrode 64, the gate electrode 23, and the semiconductor layer 40 collectively form the thin film transistor.

The data lines 62 extending in the vertical (second) direction and intersect the gate lines 22. In an exemplary embodiment, a plurality of data lines 62 and a plurality of gate lines 22 are arranged in a lattice shape, and define pixels or pixel regions.

Each of the pixels includes the thin film transistor having the gate electrode 23, the source electrode 63, and the drain electrode 64 as three terminals of the thin film transistor. Referring to FIG. 1, the source electrode 63 may protrude from the data line 62 in the first (horizontal) direction. The drain electrode 64 is arranged separated from, opposite to and facing the source electrode 63, with the channel region interposed therebetween.

The drain electrode 64 is electrically and physically connected to all of the pixel electrodes 66 through a single connecting electrode 65. The connecting electrode 65 connects second ends opposing the distal first ends of the pixel electrodes 66, and may be arranged extending in the same first (horizontal) direction in which the gate line 22 extends. The connecting electrode 65 may partially overlap the common line 25 to form a storage capacitor. The drain electrode 64, the connecting electrode 65 and a whole of the pixel electrodes 66 collectively form a single, continuous and indivisible unit.

The pixel electrode 66 extends from the connecting electrode 65 in a (second) direction and parallel to the data line 62. A plurality of pixel electrodes 66 may be provided for each pixel. In an exemplary embodiment, the pixel electrodes 66 and the common electrodes 67 are alternately arranged, to define a pixel region. The pixel electrode 66 and the common electrode 67 may be formed of opaque metal, and a space between the pixel electrode 66 and the common electrode 67 may transmit light.

The pixel electrode 66 and the common electrode 67 each may have a substantially rectangular shape elongated in the (second) direction parallel to the data line 62. The pixel electrode 66 and the common electrode 67 may have a width taken in the first direction, smaller than a width taken in the first direction of the data line 62, in order to improve an aperture ratio.

The distal first end of the pixel electrode 66 may partially overlap the common line 25. Advantageously, the partial overlap between the pixel electrode 66 and the common line 25 makes it possible to prevent light leakage.

The common electrode 67 generates an electric field together with the pixel electrode 66 to control liquid crystal, thereby adjusting the transmittance of each pixel. The common electrode 67 is electrically connected to the common line 25 through the contact hole 45.

Referring to FIG. 2A, a gate pad expansion portion 68 is disposed on the gate pad 24. In a manufacturing process, all of the gate insulating film 30, the semiconductor layer 40, and the resistive contact layers 55 and 56 on the gate pad 24 may be removed, and the gate pad expansion portion 68 may be connected directly to the gate pad 24. In an exemplary embodiment, the gate pad expansion portion 68 has a width taken in the first and/or second direction, larger than that of the gate pad 24 to facilitate connection to a gate driver IC (not shown).

The data line 62, the source electrode 63, and the gate pad expansion portion 68 may include the same material, and may be formed by a same process at substantially a same time. In addition, the drain electrode 64, the connecting electrode 65, the pixel electrode 66, and the common electrode 67 may include the same material and may be formed by a same process at substantially a same time. In an exemplary embodiment, each of the data line 62, the source electrode 63, and the gate pad expansion portion 68 may be formed in a multi-layer structure, including an upper layer (62a, 63a, and 68a) and a lower layer (62b, 63b, and 68b). Each of the drain electrode 64, the connecting electrode 65, the pixel electrode 66, and the common electrode 67 may be formed in a single layer structure.

The drain electrode 64, the connecting electrode 65, the pixel electrode 66, and the common electrode 67 are made of the same material as the lower layers 62b, 63b and 68b, of the data line 62, the source electrode 63, and the gate pad expansion portion 68, respectively. In an exemplary embodiment, a portion of the processes of forming the drain electrode 64, the connecting electrode 65, the pixel electrode 66, and the common electrode 67 are the same as those of forming the data line 62, the source electrode 63, and the gate pad expansion portion 68. A thickness taken in a cross-sectional distance (vertical in FIGS. 2A and 2B) of the drain electrode 64, the connecting electrode 65, the pixel electrode 66, and the common electrode 67 may be smaller than a thickness of the data line 62, the source electrode 63, and the gate pad expansion portion 68.

In an exemplary embodiment, the pixel electrode 66 and the common electrode 67 are disposed in the pixel region, and are configured to effect movement of liquid crystal molecules adjacent to the pixel electrode 66 and the common electrode 67. If the pixel electrode 66 and the common electrode 67 have a relatively large thickness, the liquid crystal molecules adjacent to the pixel electrode 66 and the common electrode 67 may be inclined, regardless of an electric field applied to the pixel electrode 66 and the common electrode 67. When the pixel electrode 66 and the common electrode 67 have a relatively large thickness, light leakage may disadvantageously occur proximate to or immediately near the pixel electrode 66 and the common electrode 67. In contrast, the pixel electrode 66 and the common electrode 67 may be formed to have a relatively small thickness, so as not to affect the movement of the liquid crystal molecules and reduce, or effectively prevent, light leakage. In the illustrated embodiment, each of the pixel electrode 66, the common electrode 67, and the lower layer 62b of the data line 62 may have a thickness in the cross-section of less than about 50 nanometers (nm), and the upper layer 62a of the data line 62 may each have a thickness of more than about 1500 Å.

In an exemplary embodiment, the data line 62, the source electrode 63, and the gate pad expansion portion 68 may include lower layers 62b, 63b, and 68b including at least one of molybdenum (Mo), titanium (Ti), chrome (Cr), tungsten (W), and aluminum (Al), and upper layers 62a, 63a, and 68a including at least one of copper (Cu) and molybdenum (Mo), respectively.

The lower layers 62b, 63b, and 68b of the data line 62, the source electrode 63, and the gate pad expansion portion 68 may include a metal material which has relatively good resistive contact characteristics with the resistive contact layers 55 and 56, and is capable of reducing or effectively preventing the semiconductor layer 40 from being spread. The upper layers 62a, 63a, and 68a of the data line 62, the source electrode 63, and the gate pad expansion portion 68 may include a metal material having relatively low resistance characteristics, such as to prevent a signal delay.

In an exemplary embodiment, the drain electrode 64, the connecting electrode 65, the pixel electrode 66, and the common electrode 67 each may be formed in a single layer including at least one of molybdenum (Mo), titanium (Ti), chrome (Cr), tungsten (W), and aluminum (Al). As described above, a common mask process may be used to form the wiring lines having a multi-layer structure or a single-layer structure, which will be described in detail below.

Referring to FIGS. 2A and 2B, a first protective film 71 is disposed as an uppermost layer on regions of the thin film transistor display panel other than the data line 62, the source electrode 63, and the gate pad expansion portion 68. The first protective film 71 is configured to protect almost all components other than the data line 62, the source electrode 63, and the gate pad expansion portion 68 each having a two-layer structure. In an exemplary embodiment, the first protective film may be formed by low temperature chemical vapor deposition (LTCVD) and sputtering, in order to protect a photoresist pattern (see reference numeral 211 in FIGS. 11A and 11B).

In an exemplary embodiment, the first protective film 71 may be formed of, for example, silicon oxide (SiOx), silicon oxynitride (SiOxNy), or silicon nitride (SiNx).

Next, an exemplary embodiment of a method of manufacturing the thin film transistor display panel according to the invention will be described with reference to FIGS. 3A to 11B. FIGS. 3A and 3B are diagrams illustrating exemplary embodiments of processes of manufacturing the thin film transistor display panel shown in FIG. 1, and FIG. 4A to FIG. 11B are cross-sectional views illustrating other exemplary embodiments of manufacturing processes in the method of manufacturing the thin film transistor display panel according to the invention.

Figure 4A:
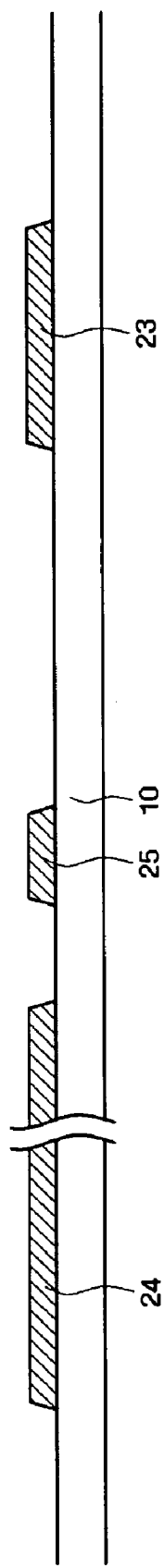
Figure 4B:
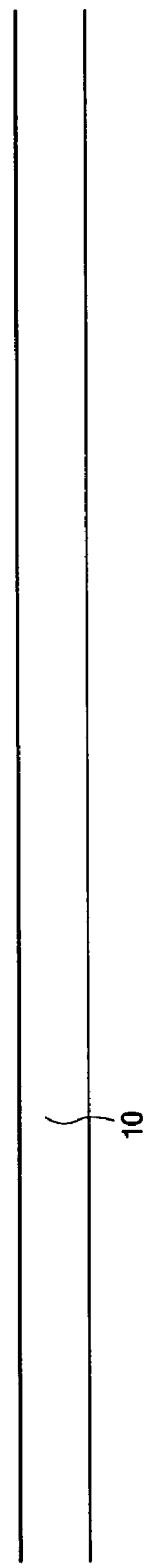

Referring to FIGS. 3A, 4A, and 4B, the gate wiring line (22, 23, and 24) and the common line 25 are formed on the insulating substrate 10. In one exemplary embodiment, a gate conductive layer is formed on the insulating substrate 10, such as by a sputtering method, and photolithography is performed on the gate conductive layer to form the gate line 22, the gate pad 24, the gate electrode 23, and the common line 25.

Figure 5A:
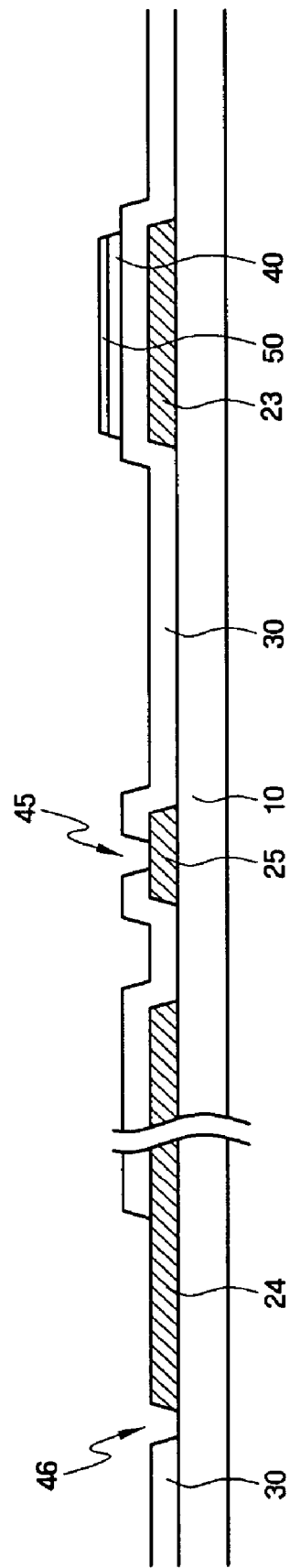
Figure 5B:
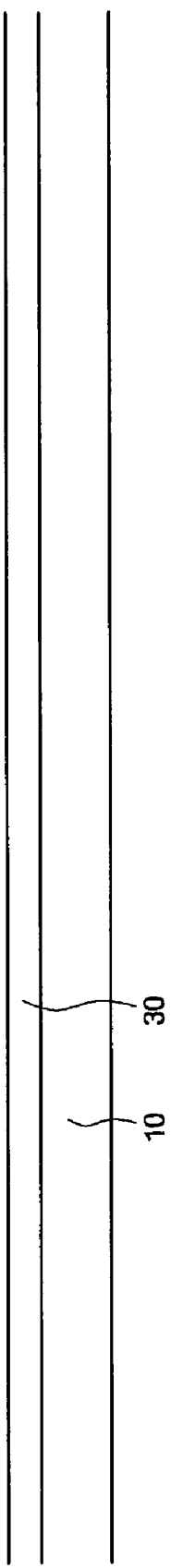

Referring to FIGS. 3B, 5A, and 5B, a gate insulating layer, a first amorphous silicon layer, and a second amorphous silicon layer are sequentially formed on the structure obtained by the processes shown in FIGS. 3A, 4A, and 4B. In one exemplary embodiment, the first amorphous silicon layer may include hydrogenated amorphous silicon, and the second amorphous silicon layer may include silicide or n+ hydrogenated amorphous silicon heavily doped with n-type impurities. The gate insulating layer, the first amorphous silicon layer, and the second amorphous silicon layer may be laminated, such as by chemical vapor deposition (CVD).

Photolithography is performed on the gate insulating layer, the first amorphous silicon layer, and the second amorphous silicon layer to form the gate insulating film 30, the semiconductor layer 40, and the amorphous silicon pattern 50. In one exemplary embodiment, photolithography is performed to remove the first amorphous silicon layer and the second amorphous silicon layer, except for a region for forming an active region on the gate electrode 23 of each pixel. The first amorphous silicon layer is etched to form the semiconductor layer 40, and the second amorphous silicon layer is etched to form the amorphous silicon pattern 50.

In one exemplary embodiment, dry etching may be performed on the first amorphous silicon layer and the second amorphous silicon layer, and the semiconductor layer 40 and the amorphous silicon pattern 50 may be etched substantially simultaneously, or separately.

Referring to FIG. 5A, photolithography is performed to dispose the contact hole 45 on the common line 25, and to dispose the gate pad contact hole 46 at an end of the gate line 22, thereby forming the gate insulating film 30.

A common etching mask may be used to etch the gate insulating layer, the first amorphous silicon layer, and the second amorphous silicon layer. In one exemplary embodiment, a common etching mask, such as a slit mask or a halftone mask, is used to sequentially form the semiconductor layer 40, the amorphous silicon pattern 50, and the gate insulating film 30.

In one exemplary embodiment, dry etching may be performed on the first amorphous silicon layer and the second amorphous silicon layer, such that the semiconductor layer 40 and the amorphous silicon pattern 50 may be etched substantially simultaneously, or separately.

Referring to FIGS. 6A and 6B, a first data conductive layer 60b and a second data conductive layer 60a are sequentially formed on the structure obtained by the processes shown in FIGS. 5A and 5B, such as by sputtering. The first data conductive layer 60b and the second data conductive layer 60a are formed on substantially an entire surface of the insulating substrate 10, so as to completely cover the gate insulating film 30, the semiconductor layer 40, and the amorphous silicon pattern 50 previously formed.

The first data conductive layer 60b is for improving resistive contact characteristics with the semiconductor layer 40, and may have a thickness of less than about 50 nanometers (nm). The second data conductive layer 60a is for forming a low-resistance wiring line, and may have a thickness of more than about 1500 Å, which is larger than the thickness of the first data conductive layer 60b.

Figure 7A:
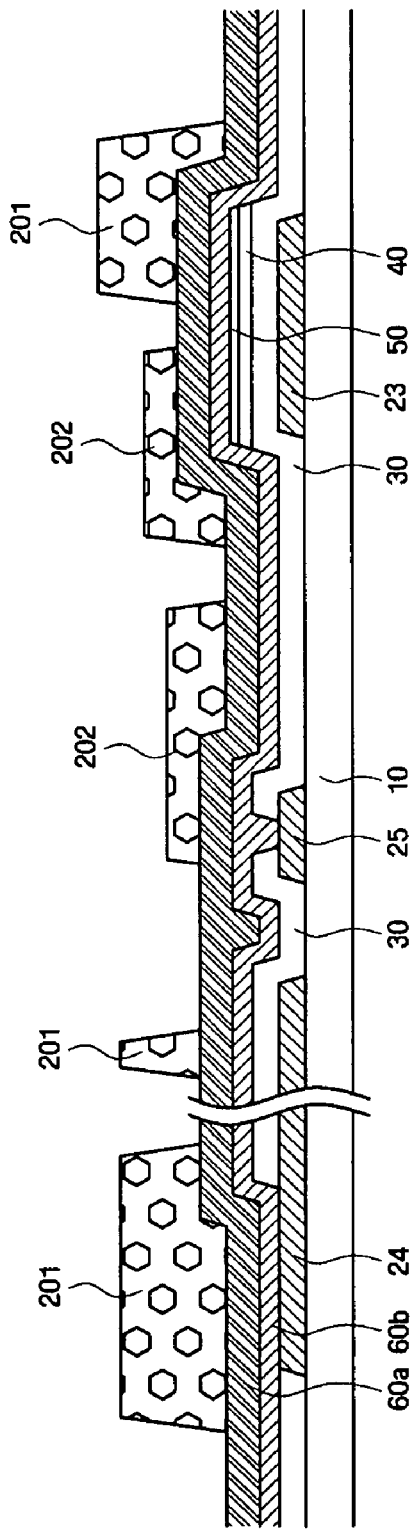
Figure 7B:
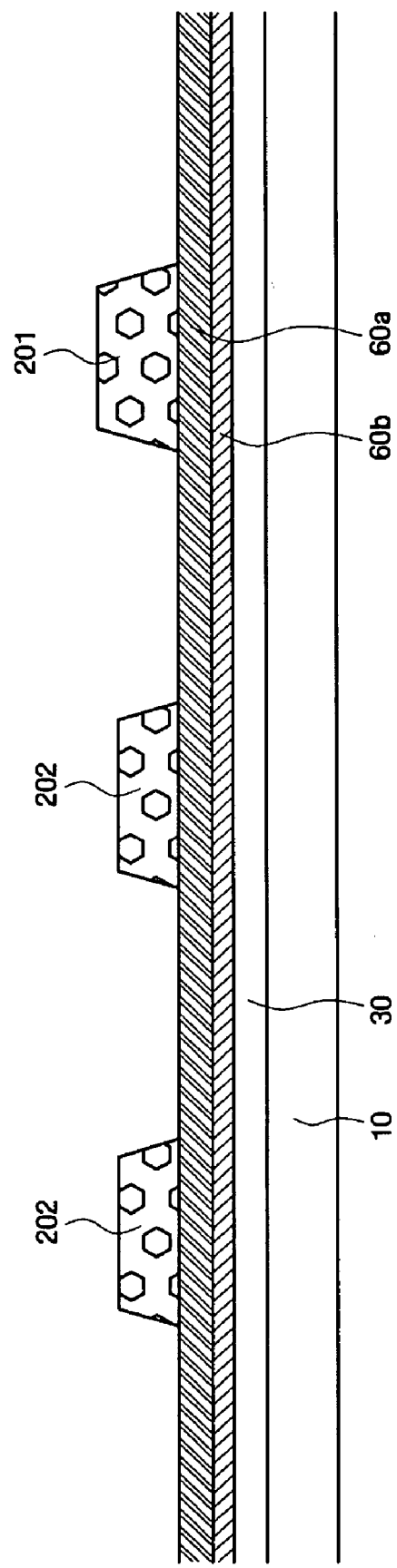

Referring to FIGS. 7A and 7B, photoresist patterns 201 and 202 are formed on the first and second data conductive layers 60b and 60a, respectively. The photoresist patterns 201 and 202 may be divided into a first region 201 and a second region 202, and the second region 202 is thinner in a direction substantially perpendicular to the insulating substrate 10 than the first region 201.

The data line 62, the source electrode 63, and the gate pad expansion portion 68 shown in FIGS. 2A and 2B, are formed in the first region 201, and the drain electrode 64, the connecting electrode 65, the pixel electrode 66, and the common electrode 67 are formed in the second region 202.

A thickness taken in the direction substantially perpendicular to the insulating substrate, and a width, taken in the first (horizontal) or second (vertical) direction of a layout view, of the photoresist patterns 201 and 202 on the first region 201 and the second region 202 have predetermined margins since the sizes of the photoresist patterns are reduced by the subsequent etching and ashing processes. In exemplary embodiments, a method of using a slit mask or a halftone mask may be used to form the photoresist patterns 201 and 202, such that the first region 201 and the second region 202 have different thicknesses.

Figure 8A:
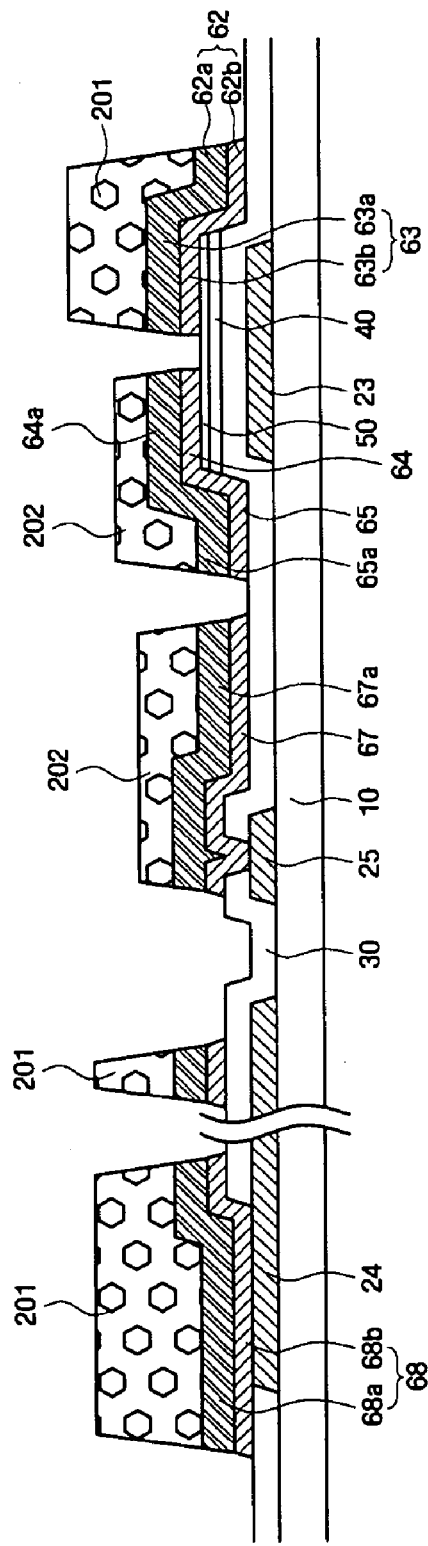
Figure 8B:
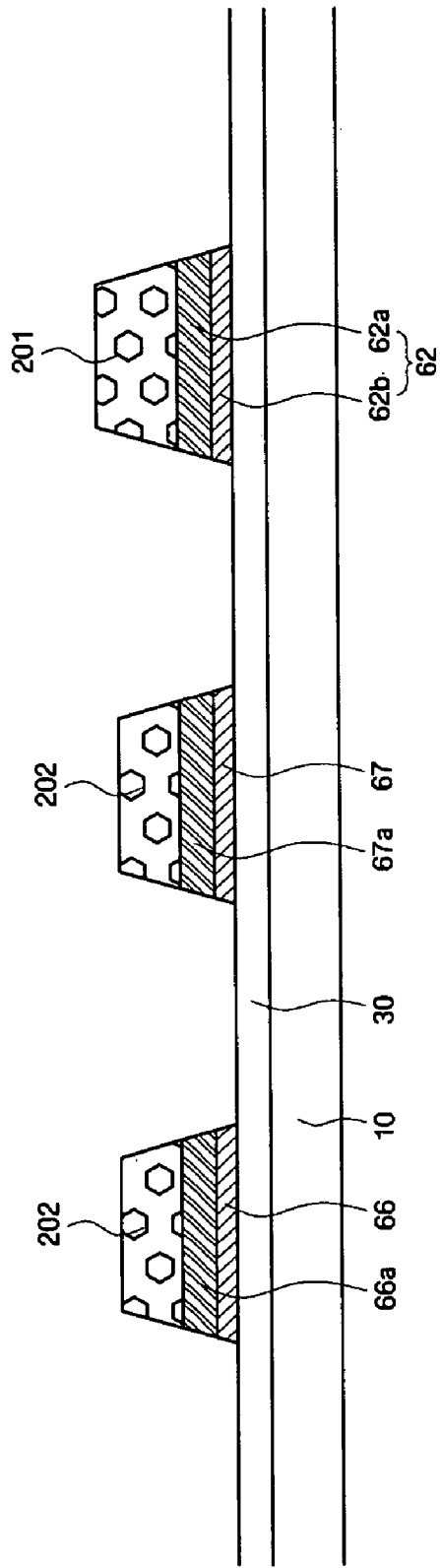

Referring to FIGS. 8A and 8B, the exposed first data conductive layer 60b and the exposed second data conductive layer 60a are etched using the photoresist patterns 201 and 202 as an etching mask. The first data conductive layer 60b and the second data conductive layer 60a may be etched depending on the type and the thickness of metal. In one exemplary embodiment, wet etching may be performed. When the first data conductive layer 60b and the second data conductive layer 60 are etched using the photoresist patterns 201 and 202 as an etching mask, the data line 62, the source electrode 63, and the gate pad expansion portion 68 respectively including the upper layers 62a, 63a, and 68a and the lower layers 62b, 63b, and 68b are formed.

The data line 62, the source electrode 63, the drain electrode 64, the connecting electrode 65, the pixel electrode 66, and the common electrode 67 are covered with the upper layers 62a, 63a, 64a, 65a, 66a, and 67a.

Referring to FIGS. 9A and 9B, portions of the photoresist patterns 201 and 202 are removed to expose the data line 62, the source electrode 63, the drain electrode 64, the connecting electrode 65, the pixel electrode 66, and the common electrode 67 respectively covered with the upper layers 62a, 63a, 64a, 65a, 66a, and 67a. In the photoresist patterns 201 and 202, the second region 202 formed on the data line 62, the source electrode 63, the drain electrode 64, the pixel electrode 66, and the common electrode 67 are removed.

In one exemplary embodiment, an ashing process using $O_2$ may be used to remove portions of the photoresist patterns 201 and 202. When the ashing process is performed on the entire photoresist patterns 201 and 202, the original second region 202 which is relatively thinner than the first region 201 is completely removed, and the thickness and the size of the original first region 201 are reduced but may not be completely removed.

As a result, a reduced photoresist pattern 211 having a relatively smaller size (e.g., thickness) than the original first region 201 photoresist pattern, as shown in FIGS. 9A and 9B, is formed.

The channel region of the second amorphous silicon pattern 50 is etched using the small (e.g., reduced) photoresist pattern 211 as an etching mask to form the resistive contact layers 55 and 56. Only the second amorphous silicon pattern 50 on the channel region is removed to expose the semiconductor layer 40 when the reduced photoresist pattern 211 is used as an etching mask. The exposed semiconductor layer 40 forms the channel of the thin film transistor.

Referring to FIGS. 10A and 10B, the upper layers (see reference numerals 64a, 65a, 66a, and 67a in FIGS. 9A and 9B) of the drain electrode 64, the connecting electrode 65, the pixel electrode 66, and the common electrode 67 are etched using the small photoresist pattern 211 as an etching mask.

As a result, the drain electrode 64, the pixel electrode 66, and the common electrode 67 form a single-layer wiring line, while the data line 62, the source electrode 63 and the gate pad expansion portion 68 remain a multi-layered structure at this point in the process.

Figure 11A:
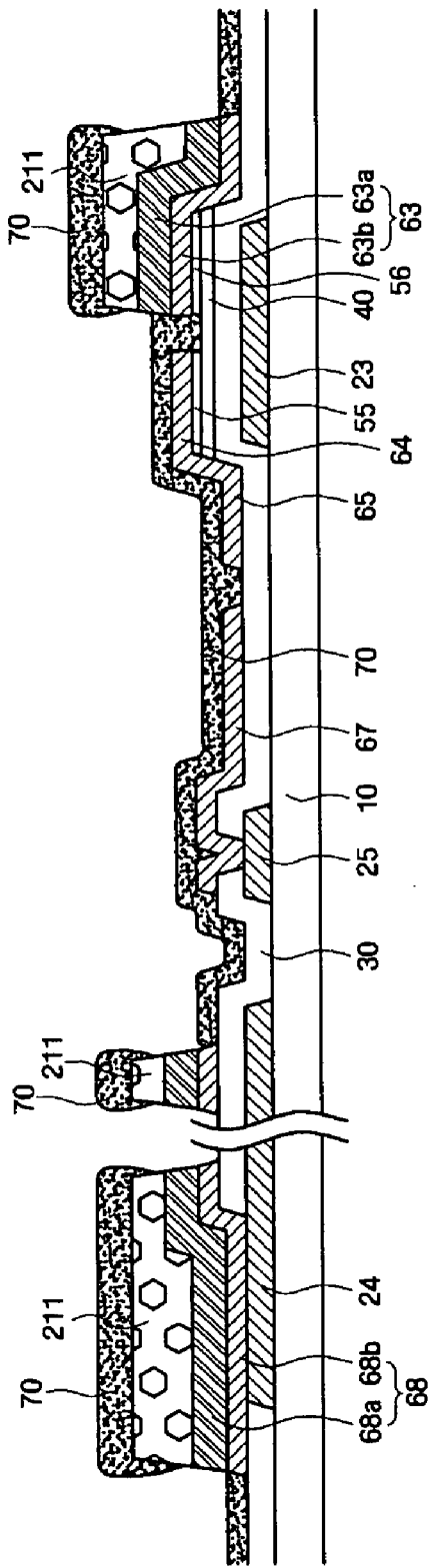
Figure 11B:
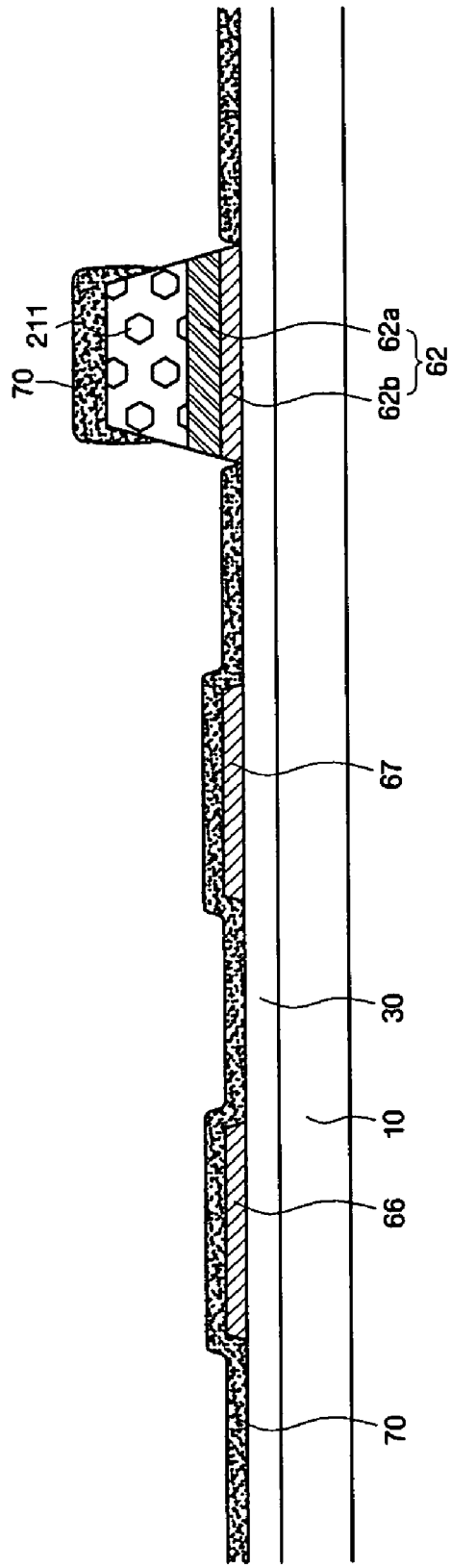

Referring to FIGS. 11A and 11B, a protective film forming material 70 is formed on the entire surface of the structure obtained by the processes shown in FIGS. 10A and 10B. The protective film forming material 70 may include silicon oxide (SiOx), silicon oxynitride (SiOxNy), or silicon nitride (SiNx). In one exemplary embodiment, the protective film forming material 70 may be laminated by low temperature chemical vapor deposition or sputtering, in order to protect the photoresist patterns 201 and 202. As illustrated in FIGS. 11A an 11B, a first portion of the protective film forming material 70 is formed on the small photoresist pattern 211, and remaining portions of the protective film forming material 70 are directly laminated on a structure which is exposed where the photoresist pattern 211 is not disposed.

Referring to FIGS. 2A and 2B again, a lift-off method is used to remove the photoresist pattern 211 and the protective film forming material 70 formed on the photoresist pattern 211. In one exemplary embodiment, the photoresist pattern 211 is removed by the following method. When a photoresist stripper, including an amine-based material or a glycogen-based material, is contacted with the photoresist pattern 211 the photoresist stripper dissolves the photoresist pattern 211 to peel off the photoresist pattern 211, and the protective film forming material 70 formed on the photoresist pattern 211 is also removed. The photoresist stripper may be contacted with the photoresist pattern 211 by an ejecting method or a dip. The removal rate of the photoresist pattern 211 and the protective film forming material 70 depends on the contact time and the contact area between the photoresist pattern 211 and the photoresist stripper.

When the photoresist pattern 211 and the protective film forming material 70 are removed by the photoresist stripper, the first protective film 71 covering regions other than the data line 62, the source electrode 63, and the gate pad expansion portion 68 is completed. The first protective film 71 is formed such that a data pad (not shown) formed at the end of the data line 62 is exposed.

Figure 12:
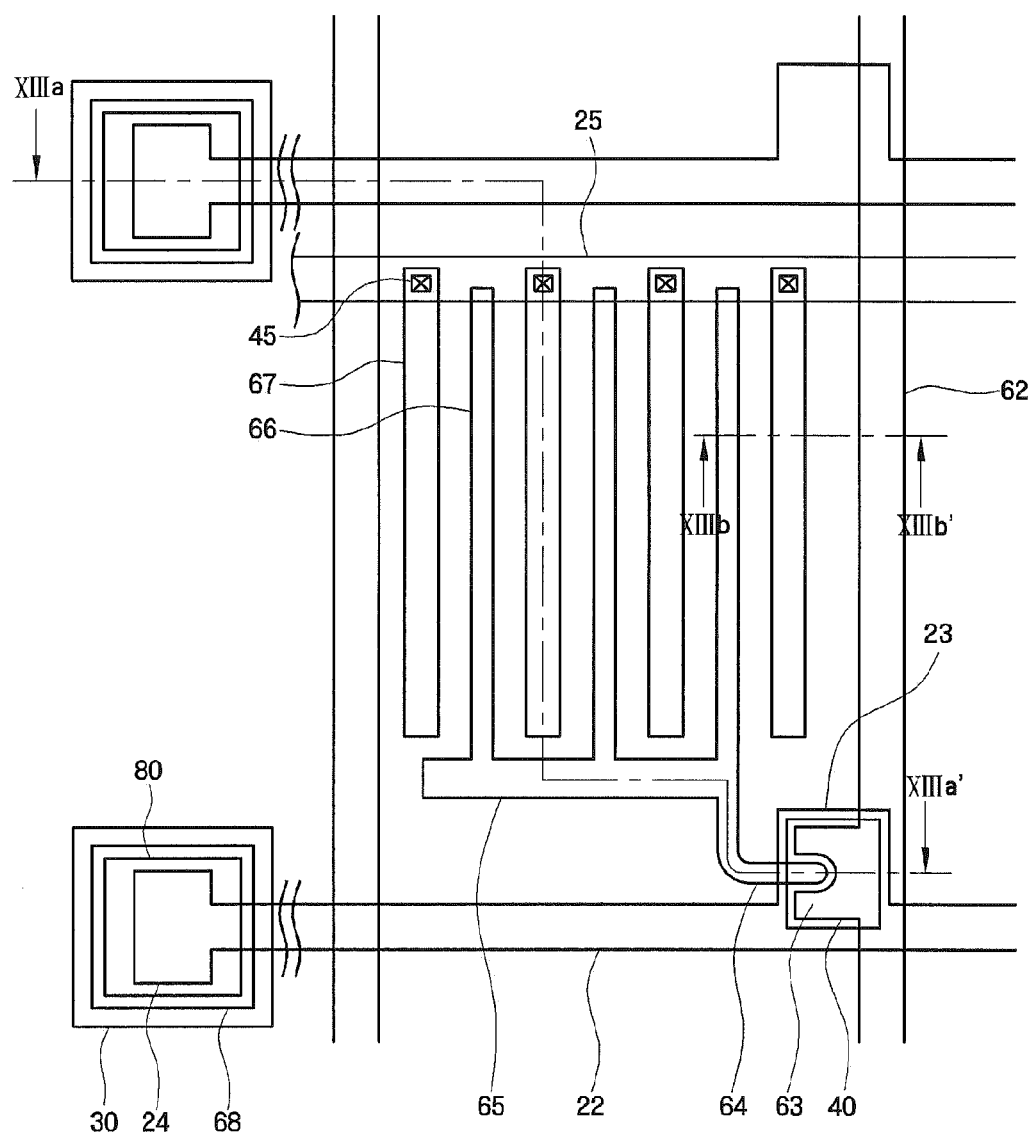
FIG. 12 is a layout view illustrating another exemplary embodiment of a thin film transistor display panel according to the invention.

Another exemplary embodiment of a thin film transistor display panel according to the invention will be described in detail with reference to FIG. 12. FIG. 12 is a layout view illustrating another exemplary embodiment of the thin film transistor display panel according to of the invention. FIG. 13A is a cross-sectional view illustrating the thin film transistor display panel taken along line XIIIa-XIIIa' of FIG. 12. FIG. 13B is a cross-sectional view illustrating the thin film transistor display panel taken along line XIIIb-XIIIb' of FIG. 12. For the convenience of description, components having the same functions as those in the first embodiment are denoted by the same reference numerals, and a detailed description thereof will be omitted.

In the illustrated embodiment of the thin film transistor display panel according to the invention, a second protective film 80 is disposed as an uppermost layer on an entire of a structure except for a portion of the gate pad 24 and a data pad (not shown). Since the data line 62 may be exposed to the outside as shown in FIGS. 2A and 2B, the electrode characteristics of the exposed data line 62 may be undesirably affected, such as by a liquid crystal layer. Advantageously, the second protective film 80 is formed to cover a whole of the exposed portions of the data line 62, effectively reducing or effectively preventing undesirable electrode characteristics relative to other elements of the thin film transistor display panel.

The second protective film 80 is formed on the data line 62 and each component to protect each component together with the first protective film 71. In an exemplary embodiment of a method of manufacturing the thin film transistor display panel of FIGS. 12, 13A and 13B includes removing a portion of the second protective film 80 overlapping the gate pad 24, the gate pad expansion portion 68 and a data pad (not shown) connected to external components (not shown).

Another exemplary embodiment of a method of manufacturing the thin film transistor display panel of FIGS. 12, 13A and 13B according to the invention may include a process subsequent to the method of manufacturing the thin film transistor display panel described with reference to FIGS. 4A to 11B. A second protective film forming material is coated on the front (e.g., uppermost) surface of the thin film transistor display panel shown in FIGS. 2A and 2B, which is the final product manufactured by the method of manufacturing the thin film transistor display panel described with reference to FIGS. 4A to 11B. In one exemplary embodiment, the second protective film forming material may include silicon oxide (SiOx), silicon oxynitride (SiOxNy), or silicon nitride (SiNx), and/or low temperature chemical vapor deposition or sputtering may be used in order to not adversely affect or damage the first protective film 71 previously formed on the structure of FIGS. 2A and 2B.

Referring again to FIGS. 13A and 13B, the second protective film forming material is coated on the front surface of the thin film transistor display panel shown in FIGS. 2A and 2B. The second protective film forming material is etched using an etching mask such that the gate pad 24 including the gate expansion portion 68 and a data pad (not shown) are exposed, thereby completing the second protective film 80. The second protective film 80 overlaps all regions of the thin film transistor display panel of FIGS. 12, 13A and 13B, except for a gate pad opening 86 and a data pad opening (not shown).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor display panel comprising:
   an insulating substrate;
   gate lines disposed on a first surface of the insulating substrate and extended in a first direction;
   data lines disposed on the first surface of the insulating substrate and extended in a second direction substantially perpendicular to the first direction, the data lines and the gate lines being electrically insulated from each other;
   common lines disposed on the insulating substrate and extended substantially in parallel to the gate lines;
   a gate insulating film disposed on the gate lines and the common lines;
   contact holes disposed through the gate insulating film and exposing a portion of the common lines;
   a plurality of common electrodes electrically connected to the common lines through the contact holes, arranged extended in the second direction and disposed substantially in parallel to each other;
   a plurality of pixel electrodes arranged extended substantially in parallel to the common electrodes; and
   thin film transistors each including a gate electrode connected to the gate lines, a source electrode connected to the data lines, and a drain electrode connected to the pixel electrodes,
   wherein
   a first thickness of the common electrodes and of the pixel electrode, is smaller than a second thickness of the data lines, the first and second thicknesses taken in a third direction substantially perpendicular to the first surface of the insulating substrate, and
   a third thickness of the drain electrode is smaller than a fourth thickness of the source electrode, the third and fourth thicknesses taken in the third direction substantially perpendicular to the first surface of the insulating substrate.

2. The thin film transistor display panel of claim 1, wherein
   each of the common electrodes and the pixel electrodes includes a single layer structure; and
   the data lines include a multi-layer structure.

3. The thin film transistor display panel of claim 2, wherein:
   the common electrodes and the pixel electrodes include copper; and
   the data lines include an upper layer including at least one of copper (Cu) and molybdenum (Mo), and a lower layer including at least one of molybdenum (Mo), titanium (Ti), chrome (Cr), tungsten (W), and aluminum (Al).

4. The thin film transistor display panel of claim 3, wherein:
   the common electrodes, the pixel electrodes, and the lower layer of the data lines each have a thickness of less than about 50 nanometers (nm); and
   the upper layer of the data lines has a thickness of more than about 1500 Å.

5. The thin film transistor display panel of claim 1, wherein:
   the drain electrode includes a single layer structure; and
   the sourced electrode includes a multi-layer structure.

6. The thin film transistor display panel of claim 1, wherein the common electrodes and the pixel electrodes are alternately arranged in the first direction.

7. The thin film transistor display panel of claim 1, further comprising a first protective film disposed directly on and contacting the pixel electrodes and the common electrodes.

8. The thin film transistor display panel of claim 7, further comprising a second protective film disposed directly on and contacting an uppermost surface of the data lines and an uppermost surface of the first protective film.

9. A thin film transistor display panel comprising:
   an insulating substrate;
   gate lines disposed on a first surface of the insulating substrate and extended in a first direction:
   data lines disposed on the first surface of the insulating substrate and extended in a second direction substantially perpendicular to the first direction, the data lines and the gate lines being electrically insulated from each other;

common lines disposed on the insulating substrate and extended substantially in parallel to the gate lines;

a gate insulating film disposed on the gate lines and the common lines;

contact holes disposed through the gate insulating film and exposing a portion of the common lines;

a plurality of common electrodes electrically connected to the common lines through the contact holes, arranged extended in the second direction and disposed substantially in parallel to each other;

a plurality of pixel electrodes arranged extended substantially in parallel to the common electrodes; and thin film transistors each including a gate electrode connected to the gate lines, a source electrode connected to the data lines, and a drain electrode connected to the pixel electrodes; and a single connecting electrode connecting the pixel electrodes and the drain electrodes, the connecting electrode, the pixel electrodes and the drain electrodes being a continuous member;

wherein a third thickness of the drain electrode and of the connecting electrode, is smaller than a fourth thickness of the source electrode, the third and fourth thicknesses taken in the third direction substantially perpendicular to the first surface of the insulating substrate.

10. A method of manufacturing a thin film transistor display panel, the method comprising:

forming on a first surface of an insulating substrate, a plurality of gate lines extended in a first direction, and a plurality of common lines arranged substantially in parallel to the gate lines;

forming a gate insulating film on and contacting the gate lines and the common lines;

forming contact holes in the gate insulating film and disposed overlapping the common lines;

forming a plurality of common electrodes electrically connected to the common lines through the contact holes, extended in a second direction substantially perpendicular to the first direction, and arranged in parallel to each other, a plurality of pixel electrodes extended in the second direction and arranged in parallel to the common electrodes, and a plurality of data lines intersecting the gate lines; and forming thin film transistors each including a gate electrode connected to the gate lines, a source electrode connected to the data lines, and a drain electrode connected to the pixel electrodes, wherein a first thickness of the common electrodes and of the pixel electrodes is smaller than a second thickness of the data lines, the first and second thicknesses taken in a third direction substantially perpendicular to the first surface of the insulating substrate, and a third thickness of the drain electrode is smaller than a fourth thickness of the source electrode, the third and fourth thicknesses taken in the third direction substantially perpendicular to the first surface of the insulating substrate.

11. The method of claim 10, wherein:
each of the common electrodes and the pixel electrodes include a single layer structure; and
the data lines include a multi-layer structure.

12. The method of claim 11, wherein:
the common electrodes and the pixel electrodes include copper; and
the data lines include an upper layer including at least one of copper (Cu) and molybdenum (Mo), and a lower layer including at least one of molybdenum (Mo), titanium (Ti), chrome (Cr), tungsten (W), and aluminum (Al).

13. The method of claim 10, wherein:
the drain electrode includes a single layer structure; and
the source electrode includes a multi-layer structure.

14. The method of claim 10, wherein the common electrodes and the pixel electrodes are alternately arranged in the first direction.

15. The method of claim 10, wherein the forming the data lines, the common electrodes, and the pixel electrodes comprises:

sequentially forming a first data conductive layer and a second data conductive layer on the insulating substrate;

forming a photoresist pattern on the first and second data conductive layers using a slit mask or a halftone mask; and etching the first and second data conductive layers using the photoresist pattern as an etching mask.

16. The method of claim 15, wherein:
the photoresist pattern includes a first region overlapping the data lines, and a second region overlapping both the common electrodes and the pixel electrodes; and
the second region of the photoresist pattern is thinner than the first region in the third direction.

17. The method of claim 10, further comprising forming a first protective film on the pixel electrodes and the common electrodes.

18. The method of claim 17, further comprising forming a second protective film on the data lines and the first protective film.

* * * * *